United States Patent
Huang et al.

(10) Patent No.: US 9,768,761 B2
(45) Date of Patent: Sep. 19, 2017

(54) VOLTAGE COMPARATOR CIRCUIT AND METHOD

(71) Applicant: Fairchild Semiconductor Corporation, Sunnyvale, CA (US)

(72) Inventors: Lei Huang, Beijing (CN); Jianing Zhou, Beijing (CN); Zhaohong Li, Beijing (CN)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 15/154,245

(22) Filed: May 13, 2016

(65) Prior Publication Data

US 2016/0336932 A1    Nov. 17, 2016

(30) Foreign Application Priority Data

May 14, 2015  (CN) .......................... 2015 1 0246414

(51) Int. Cl.
*H03K 5/24*    (2006.01)

(52) U.S. Cl.
CPC ......... *H03K 5/2472* (2013.01); *H03K 5/2481* (2013.01)

(58) Field of Classification Search
CPC ...... H03K 5/24; H03K 5/2418; H03K 5/2445; H03K 5/249; H03K 7/08
USPC .............................................. 327/63, 70, 88
See application file for complete search history.

(56) References Cited

U.S. PATENT DOCUMENTS

| 6,788,114 B1 * | 9/2004 | Krenzke | ................. | H03K 5/08 327/70 |
| 8,098,062 B2 * | 1/2012 | Kilian | ................... | H03K 19/18 324/207.2 |

* cited by examiner

*Primary Examiner* — John Poos
(74) *Attorney, Agent, or Firm* — Brake Hughes Bellermann LLP

(57) ABSTRACT

This document discusses, among other things, a voltage comparator, an integrated circuit, or a voltage comparison method having increased precision. The hysteresis comparator or the integrated circuit can include first and second input transistors, each having a gate configured to receive a respective first or second input voltage. A bias power source can generate a bias current to a first node by applying a voltage through a first resistor. The first node can be connected to a source of the first input transistor through a second resistor and to a source of the second input transistor through a third resistor. The first, second, and third resistors can include the same type of resistor, with the second and third resistors having different resistance values.

20 Claims, 6 Drawing Sheets

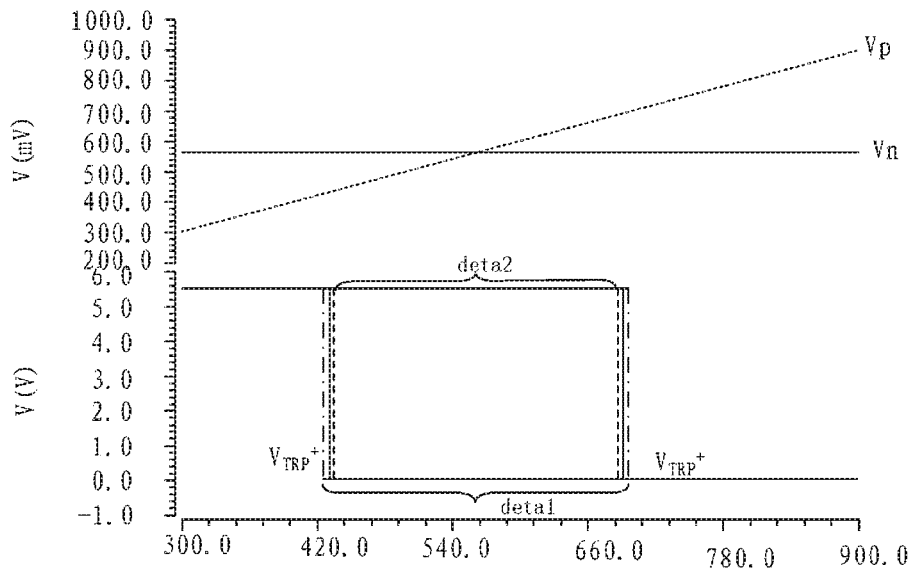

Apply a first input voltage to a gate of a first input transistor

S102

Apply a second input voltage to a gate of a second input transistor

S103

Generate a bias current by using a first resistor

S104

Make a part of the bias current flow into a source of the first input transistor through a second resistor, and other part of the bias current flow into a source of the second input transistor through a third resistor

S105

Output a signal indicating that a drain voltage of the first input transistor is greater than or less than a drain voltage of the second input transistor

Fig. 9

VOLTAGE COMPARATOR CIRCUIT AND METHOD

CLAIM OF PRIORITY

This application claims the benefit of priority under 35 U.S.C. §119(a) of Lei Huang et al. CN Application No. 201510246414.7, filed on May 14, 2015, which is hereby incorporated by reference in its entirety.

BACKGROUND

In circuit design, a hysteresis comparator is generally used to eliminate interferences of some noise voltages lower than a threshold voltage. The hysteresis comparator generally comprises a first input terminal, a second input terminal and an output terminal. Of an input voltage Vp of the first input terminal and an input voltage Vn of the second input terminal, the output terminal outputs a corresponding logic high level or logic low level. The logic high level and the logic low level are relative, and generally, a level corresponding to the logic high level and a level corresponding to the logic low level are relative to the same reference level, and the level corresponding to the logic high level is higher than the level corresponding to the logic low level. For example, the level corresponding to the logic low level may be 0 V, relative to a ground level, and the level corresponding to the logic high level may be any voltage value (it should be a voltage value greater than 2.5 V in an actual circuit) greater than 0 V, relative to a ground point level.

The hysteresis comparator will generate a hysteresis voltage Vhy. Due to the generation of the hysteresis voltage Vhy, when $Vp-Vn>V_{TRP}^+$, the output terminal Vo outputs a logic high level, and when $Vn-Vp<V_{TRP}^-$, the output terminal Vo outputs a logic low level. It is assumed that a voltage output by the output terminal is Vo, and in this way, for the hysteresis comparator, the Vo will not turn between the logic high level and the logic low level at the instant of Vp=Vn. $Vhy=V_{TRP}^+ - V_{TRP}^-$. Generally, the $V_{TRP}^+$ is a positive threshold voltage; the $V_{TRP}^-$ is a negative threshold voltage; and the Vhy is a difference obtained by subtracting the negative threshold voltage from the positive threshold voltage. The $V_{TRP}^+$ and the $V_{TRP}^-$ are two threshold values for performing voltage comparison.

For an ideal hysteresis comparator, the hysteresis voltage thereof should not be affected by factors such as the temperature or the manufacturing processes of electronic elements, and a stable hysteresis voltage should be provided regardless of the working environment, thereby ensuring the stability and precision of the work performance of the hysteresis comparison circuit. Moreover, hysteresis voltages of hysteresis comparators of the same model generated by the same batch have a small variance, thereby ensuring the stability and precision of products in a batch production.

OVERVIEW

This document discusses, among other things, a voltage comparator, an integrated circuit, or a voltage comparison method having increased precision.

The voltage comparator, such as a hysteresis comparator or an integrated circuit, can include first and second input transistors, an output terminal, a first node, a comparison output circuit, and a bias power source. The first input transistor can include a gate configured to receive a first input voltage and the second input transistor can include a gate configured to receive a second input voltage. The first node can be connected to a source of the first input transistor through a second resistor and to a source of the second input transistor through a third resistor. The comparison output circuit can be connected to a drain of the first input transistor and to a drain of the second input transistor, and can be configured to provide, to the output terminal, a signal indicating that a drain voltage of the first input transistor is greater than or less than a drain voltage of the second input transistor. The bias power source can be configured to generate a bias current by applying a voltage to a first resistor, and to provide the bias current to the first node. The first resistor, the second resistor, and the third resistor can include the same type of resistor, and the second resistor and the third resistor can have different resistance values.

The bias power source can include a reference voltage source configured to apply a voltage to the first resistor to form a first current and a current mirror configured to mirror the first current to form the bias current. In an example, the reference voltage source can include a band-gap voltage source capable of providing a band-gap voltage. The first resistor can include m1 fourth resistors having a first resistance value, where m1 is an integer not less than 1. The second resistor can include m2 fourth resistors having the first resistance value, where m2 is 0 or a positive integer. The third resistor can include m3 fourth resistors having the first resistance value, where m3 is 0 or a positive integer.

The voltage comparator can include a selection circuit configured to select resistance values of the second resistor and the third resistor. The voltage comparator can include a resistor string formed by connecting multiple resistors end to end. One end of the resistor string can be connected to the source of the first input transistor, and the other end can be connected to the source of the second input transistor. The selection circuit can include multiple selection paths connected between different resistors of the resistor string, and can switch on one of the selection paths of a selection input, so as to implement selection of the resistance values of the second resistor and the third resistor.

The voltage comparison method can include applying a first input voltage to a gate of a first input transistor, applying a second input voltage to a gate of a second input transistor, and generating a bias current by using a first current. A part of the bias current can flow into the source of the first input transistor through the second resistor, and another part of the bias current can flow into the source of the second input transistor through the third resistor. The method can include outputting a signal indicating that a drain voltage of the first input transistor is greater than or less than a drain voltage of the second input transistor. The first, second, and third resistors can include the same type of resistor, in certain examples, having different resistance values.

Generating the bias current using the first current can include applying a voltage to the first resistor to generate a first current and mirroring the first current to generate the bias current. Generating the first current flowing through the first resistor can include applying a band-gap voltage to the first resistor and generating the first current by the application of the band-gap voltage on the first resistor.

The method can include receiving a selection input and selecting, of the selection input, the second and third resistance values for partial currents of the bias current to pass through.

The second resistor can be connected to the source of the first input transistor, and the third resistor can be connected to the gate of the second data transistor. The second and third resistors can have different resistance values, and in this way, by using voltage division of the second resistor and the third resistor, when a source-drain current Ids of the first input transistor is equal to a source-drain current Ids of the second input transistor, source voltages of the first input transistor and the second input transistor can be different. In this way, when the drain of the first input transistor and the drain of the second input transistor have the same voltage, it is a turning point of a comparison result of the hysteresis comparator. If it is assumed that an input voltage of a first input terminal is Vp, an input voltage of a second input terminal is Vn, Vp−Vn=$V_{TRP}^{+}$ or Vn−Vp=$V_{TRP}^{-}$ corresponding to the turning point. In this case, the first voltage applied to two ends of the second resistor and the second voltage applied to the third resistor equal to the $V_{TRP}^{+}$ and the $V_{TRP}^{-}$ respectively.

When performing this voltage comparison, the turning point of the comparison result is not the time when Vp is equal to Vn, and this voltage comparison is the hysteresis comparison. The hysteresis comparison circuit of this embodiment implements hysteresis comparison of voltages by using different resistance values of the second resistor and the third resistor. The voltages divided for the first resistor and the second resistor is further related to the bias current. In the voltage comparator in the embodiments of the present application, the first resistor is introduced, and the first resistor can generate the first current based on the bias voltage. The first current can be equal to the bias current. The first resistor, the second resistor, and the third resistor are the same type of resistor; therefore, processes and influences caused by environmental parameters of the first resistor, the second resistor, and the third resistor can all be the same, and in this way, process offset errors and environmental errors may be offset, so that the voltage comparator can be more precise and provide a more stable comparison result.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5B is a schematic circuit diagram of a selection circuit applicable to the circuit shown in FIG. 5A;

FIG. 8 is a schematic simulation effect diagram of a hysteresis comparator provided in an embodiment;

FIG. 9 is a schematic flow chart of a voltage comparison method provided in an embodiment.

DETAILED DESCRIPTION

Figure 1:
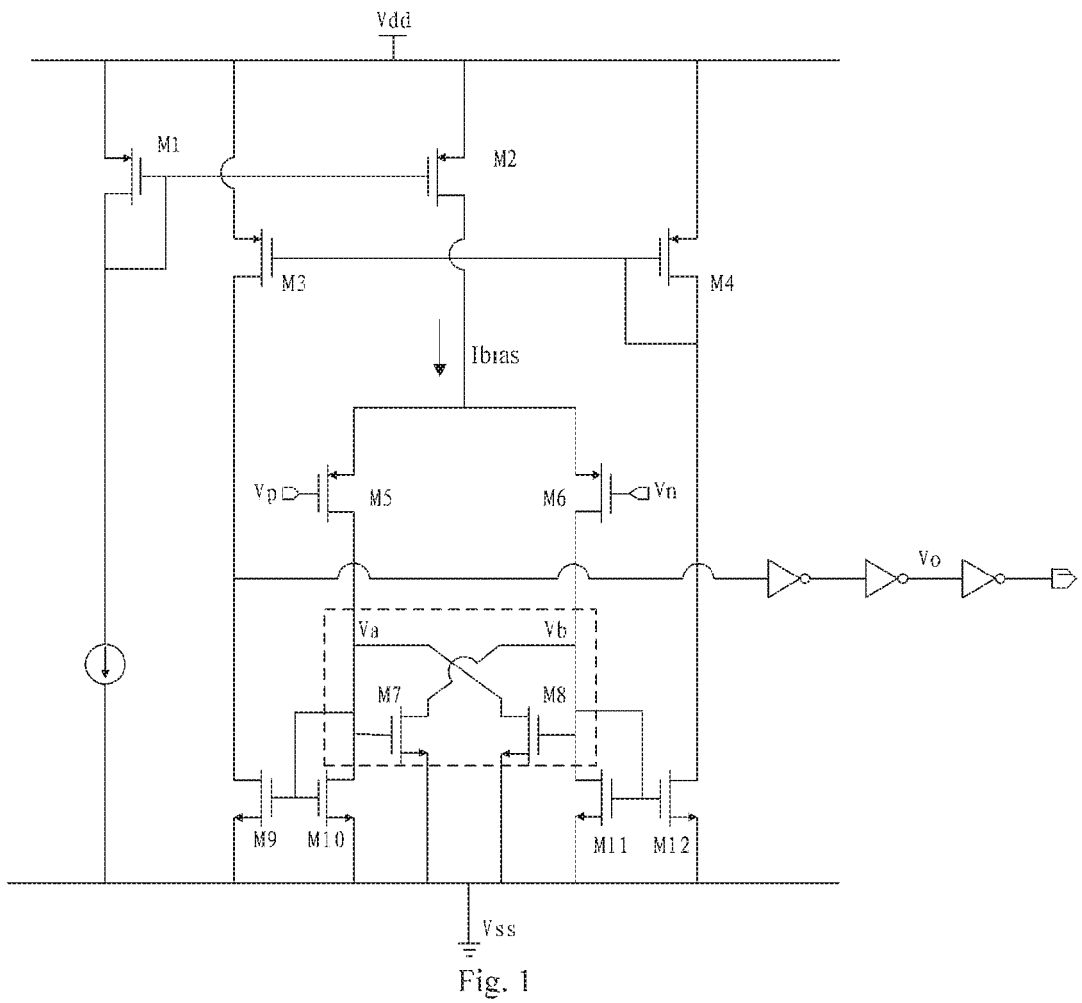
FIG. 1 is a schematic structural diagram of a hysteresis comparator.

FIG. 1 is a schematic structural diagram of a hysteresis comparator including a power source anode Vdd, a power source cathode Vss, and transistors M1 to M12 of the hysteresis comparator.

The Vdd is configured to be connected to an anode of a power supply of the hysteresis comparator, and the Vss is configured to be connected to a cathode of the power supply of the hysteresis comparator. The hysteresis comparator further comprises a first input terminal and a second input terminal, an input voltage of the first input terminal is Vp, an input voltage of the second input terminal is Vn, and Vp and Vn are two voltages to be compared.

The Vp corresponds to a gate of a transistor M1, and the Vn corresponds to a gate of a transistor M2. In FIG. 1, the M1 is a P-channel metal oxide semiconductor (PMOS) field effect transistor, the M2 is a gate of another P-channel metal oxide semiconductor (PMOS) field effect transistor. Generally, the two PMOSs have the same electrical parameters.

Characteristics of the transistors can be described as follows:

$$Ids = \{\mu_n C_{ox} W (V_{GS} - V_{th})^2\}/(2L),$$

where β is proportional to $\mu_n C_{ox}$ W/L, the Ids represents a current flowing between a source and a drain of the transistor, the $V_{GS}$ is a voltage applied between a gate and the source of the transistor, the $V_{th}$ is a switch-on voltage of the transistor; the $\mu_n$ is the mobility ratio, a capacitance value of an oxide layer between the gate of the $C_{ox}$ transistor and a substrate, the W is the width of a transistor channel, and the L is the length of the transistor channel.

Transistors M1 and M2 form a current mirror. Transistors M9 and M10, and M11 and M12 form additional current mirrors. The $\beta_7$ of M7 is greater than the $\beta_{10}$ of M10, and $\beta_8$ of M8 is greater than the $\beta_{11}$ of M11, and in this way, forward feedback can be provided to the hysteresis comparator, and the forward feedback may be used to generate a hysteresis voltage Vhy.

In the hysteresis comparator shown in FIG. 1, if Vp is far less than Vn, and in this case, a gate-source voltage $V_{GSM5}$ applied to M5 is greater than $V_{GSM5}$ applied to M6. In this example, M5 and M6 are the same transistor, and sources of M5 and M6 are connected to a drain of M2, so the source voltages of the M5 and M6 are equal. Vp is far less than Vn, and it represents that an absolute value of the gate-source voltage of M5 is greater than an absolute value of the gate-source voltage of M6, and of the formula Ids={$\mu_n C_{ox}$W$(V_{GS}-V_{th})^2$}/(2L), it can be known that a current $i_5$ flowing through M5 is greater than current $i_6$ flowing through M6.

In this example, M7 and M8 are the same transistors, and M11 and M10 are the same transistors. In this case, M7 and M10 are switched on, M8 and M11 are switched off, a voltage Va is greater than a voltage Vb. A current on the M10 is equal to the $i_5$, and through a current mirror of M9 and M10, M9 mirrors the current to a path connecting M9 and M3. In this case, M4 and M12 are switched off, and the gate voltage of M4 is approximately equal to the voltage of Vdd. Therefore, the gate voltage of M4 is equal to the gate voltage of M3, and M3 is switched off. However, the gate voltage Va of M9 is large, M9 has a large pull-down capability, a drain voltage of M9 is pulled to be very low, the drain of M3 outputs a logic low voltage, and Vo is a logic high voltage.

If the output level of the output terminal connected to the drain of M3 needs to be changed, M3 needs to exit a switch-off region, that is, the current on M12 is increased, M4 is switched on, and the $V_{GS}$ switch-on of M3 is greater than a start voltage of M3, so that M3 exits the switch-off region. Therefore, the current on M7 needs to be reduced, and as a result, the $V_{GS}$ on M6 needs to be relative to the $V_{GS}$ of M5.

If M4 needs switched on, the drain voltage Va of the M5 needs to be equal to the drain voltage Vb of the M6. Moreover, the $\beta_7$ is greater than the $\beta_{10}$. The M7 and the M8 will form forward feedback, and if it is needed that Va is equal to Vb, the M7 needs to further obtain a greater current, so that the Vp will gradually increase, and only when the Vp is greater than the Vn and greater than a certain value, the Va is equal to the Vb, and the Vo turns. The certain value is the forward threshold voltage. In this way, hysteresis comparison is implemented by making $\beta_7$ greater than $\beta_{10}$. The same principle is also applicable when Vp is far greater than Vn.

In the hysteresis comparator shown in FIG. 1, when the forward input voltage Vp is far less than Vn, M5, M7, M6, M10 and M9 are switched on, and M8, M11, M12, M4 and M3 are all in a switch-off state. In this case, the circuit electrical signals shown in FIG. 1 have the following relationships:

$V_{TRP}^+ = V_{GSM5} - V_{GSM6}$ $V_{GSM5} = (2i_5/\beta_5)^{1/2} + V_{T5}$ $i_5 = \{\beta_{10}(V_{GSM10} - V_{T10})^2\}/2$ $V_{GSM6} = (2i_6/\beta_6)^{1/2} + V_{T6}$ $i_6 = \{\beta_7(V_{GSM7} - V_{T7})^2\}/2$ $Ibias = i_5 + i_6$ $\beta_7 > \beta_{10}$ When the forward input gradually drops to near the negative threshold $V_{TRP}^-$, the bias power source Ibias respectively passes through M5, M6, M8 and M11, and does not pass through M4, M3 and M11. In this case, the circuit electrical signals shown in FIG. 1 have the following relationships:

$V_{TRP}^- = V_{GSM6} - V_{GSM5}$ $V_{GSM6} = (2i_6/\beta_6)^{1/2} + V_{T6}$ $I_6 = \{\beta_{11}(V_{GSM11} - V_{T11})^2\}/2$ $V_{GSM5} = (2i_5/\beta_5)^{1/2} + V_{T5}$ $I_5 = \{\beta_7(V_{GSM8} - V_{T8})^2\}/2$ $Ibias = i_5 + i_6$ $\beta_8 > \beta_{11}$ $Vhy = V_{TRP}^+ - V_{TRP}^-$, where the $V_{GSM5}$ is the gate-source voltage of the M5, the $V_{GSM6}$ is the gate-source voltage of the M6, the $V_{GSM10}$ is the gate-source voltage of the M10, and the $V_{GSM7}$ is the gate-source voltage of the M7. The $i_5$ is the current flowing through the M5, and the $i_6$ is the current flowing through the M6. The $V_{T5}$ is a switch-on voltage of the M5, the $V_{T6}$ is a switch-on voltage of the M6, the $V_{T7}$ is a switch-on voltage of the M7, the $V_{T8}$ is a switch-on voltage of the M8, the $V_{T10}$ is a switch-on voltage of the M10, and the $V_{T11}$ is a switch-on voltage of the M11. Generally, switch-on voltages of the NMOSs are approximately the same, and switch-on voltages of the PMOSs are approximately the same.

It can be known from the above relationships that, influence parameters of the hysteresis voltage comprise the bias current, $\beta_5$, $\beta_6$, $\beta_8$, $\beta_{10}$ and $\beta_{11}$. M5 and M6 can include P-channel metal oxide semiconductor (PMOS) field effect transistors, and M7, M8, M10 and M11 can include N-channel metal oxide semiconductor (NMOS) field effect transistors. The PMOS and the NMOS have different types of doping carriers, and may have different carrier concentrations. In this way, the PMOS and the NMOS may have different mobility ratios, and when being affected by the same temperature, they have different influences on the hysteresis voltage caused by the doping carrier type and the carrier concentration, which cannot be offset. Moreover, the PMOS and the NMOS are different types of MOS transistors, process errors due to manufacturing processes may be greatly different, and therefore, hysteresis voltages of the same batch of hysteresis comparator in a batch production may have a large difference, thereby affecting the hysteresis voltage of the hysteresis comparator.

At the same time, the generation process of the bias current Ibias can affect the hysteresis voltage. It is assumed that Ibias is equal to a current flowing through a resistor in the first current mirror, in this case, Ibias is equal to a ratio of a voltage applied to two ends of the resistor and a resistance value of the resistor, and therefore, the bias current will be affected by the resistance value of the resistor.

In view of the above, factors affecting the hysteresis voltage comprise $\beta_5$, $\delta_6$, $\beta_8$, $\beta_{10}$, $\beta_{11}$ and the resistor. There are many parameters affecting the stability and precision of the hysteresis voltage, many types of elements affecting the hysteresis voltage, and the influences cannot be offset; therefore, the fluctuation amplitude of the hysteresis voltage is large, thereby causing insufficient stability and precision of the work performance of the hysteresis comparator.

In an actual use, it is found that the fluctuation amplitude of the hysteresis voltage Vhy caused by the circuit shown in FIG. 1 may reach 30%.

In view of this, in the following embodiments provided in the present application, resistors are used to generate the hysteresis voltage, and resistors are used to control generation of the bias current forming the hysteresis voltage. The resistor for generating the bias current and the resistor for generating the hysteresis voltage are the same type of resistor. In this way, the resistors of the same type have the same or similar manufacturing processes and influences caused by environmental parameters; therefore, process errors and influences caused by environmental parameters may be offset, thereby providing a stable hysteresis voltage, and further improving the precision and stability of a comparison result of the hysteresis comparator.

Figure 2A:
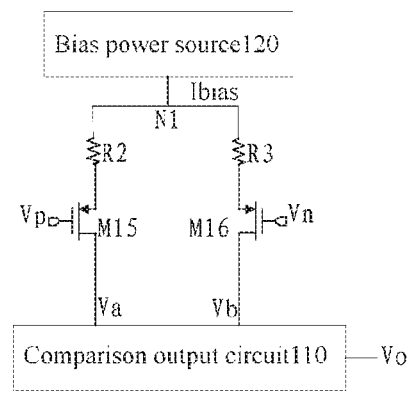
FIG. 2a is a schematic structural diagram of a first hysteresis comparator provided in an embodiment.

FIG. 2a is a schematic structural diagram of a first hysteresis comparator provided in an embodiment, the hysteresis comparator including:

a first input terminal Vp, configured to receive a first input voltage;

a second input terminal Vn, configured to second a first input voltage;

an output terminal Vo;

a first input transistor M15, a gate thereof being connected to the first input terminal Vp;

a second input transistor M16, a gate thereof being connected to the second input terminal Vn;

a first node N1, connected to a source of the first input transistor M15 and a source of the second input transistor M16;

a comparison output circuit 110, connected to a drain of the first input transistor M15 and a drain of the second input transistor M16, and configured to provide, to the output terminal Vo, a signal indicating that a drain voltage of the first input transistor M15 is greater than or less than a drain voltage of the second input transistor M16; and a bias power source 120, configured to generate a bias current by applying a voltage to a first resistor R1, and provide the bias current Ibias to the first node N1; wherein the first node N1 is connected to the source of the first input transistor M15 through a second resistor R2, and connected to the source of the second input transistor M16 through a third resistor R3, the first resistor R1, the second resistor R2 and the third resistor R3 are the same type of resistor, and the second resistor R2 and the second resistor R3 have different resistance values.

In FIG. 2a, the Va represents the drain voltage of the M15, and the Vb represents the drain voltage of the M16.

It can be seen from FIG. 2a that a sum of the current flowing through the second resistor R2 and the current flowing through the second resistor R3 equal to the bias current Ibias.

The first resistor R1, the second resistor R2 and the third resistor R3 all can represent one or more resistors. For example, the second resistor R2 and the third resistor R3 in this embodiment are the same type of resistor but having different resistance values. A resistance value of one of the second resistor R2 and the third resistor R3 may be 0 Ohm.

The resistors generally applied to the silicon process may further comprise the following types: a well resistor, a poly resistor, a p+ resistor, an n+ resistor, and the like. In this embodiment, the first resistor, the second resistor and the third resistor generally select resistors of the same type in the silicon process.

In this embodiment, the first resistor, the second resistor and the third resistor should at least be resistors belonging to the same category; and the manufacturing processes of the resistors of the same type should be the same or similar, and they have approximately the same process errors.

In FIG. 2a, the first input transistor M15 and the second input transistor M16 may both be PMOSs; however, the first input transistor and the second input transistor may also be NMOSs.

In this embodiment, the comparison output circuit 110 outputs a corresponding signal of voltage magnitudes of Va and Vb. The signal may correspondingly be a logic high level or a logic low level, and the signal may be used to represent the magnitude of the input voltage of the first input terminal and the second input terminal. In the hysteresis comparator in this embodiment, when Va is equal to Vb, it is a critical point that a signal output by the output terminal Vo turns. When Va is equal to Vb, structures of the comparison output circuit 110 that are connected to the drain of the first input transistor M15 and to the drain of the second input transistor M16 are generally symmetric. If it is needed to keeping Va being equal to Vb, gate-source voltages on the first input transistor M15 and the second input transistor M16 need to keep consistent. It should be noted that, the first input transistor M15 and the second input transistor M16 are the same transistors. The second resistor R2 and the third resistor R3 have different resistance values, and both the second resistor R2 and the third resistor R3 are connected to the first node N1; in this way, the gate-source voltages may be consistent only when Vn does not equal to Vp. Generally, one of Vn and Vp is a changeable voltage, and in this way, currents of the second resistor R2 and the third resistor R3 divided from Ibias also change; therefore, hysteresis comparison may be formed. Corresponding to the turning point, $Vp-Vn=V_{TRP}^+$ or $Vn-Vp=V_{TRP}^-$, and $Vhy=V_{TRP}^+-V_{TRP}^-$.

In this embodiment, the first resistor R1 forming the current equal to the bias current Ibias is a resistor the same as the second resistor R2 and the third resistor R3. The bias current is inversely proportional to R1, and therefore, the hysteresis voltage is inversely proportional to R1, and is proportional to a resistance difference between R2 and R3. In this way, R1, R2 and R3 have the same or similar manufacturing processes, and have the same or similar influences caused by the temperature, so that at least partial influences caused by process errors or environmental parameters can be offset, thereby reducing the offset of the hysteresis voltage of the hysteresis comparator caused by the process errors and changes of the environment parameters, so as to improve the precision of the comparison result of the hysteresis comparator.

Figure 2B:
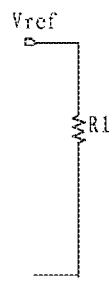
FIG. 2b is a schematic structural diagram of a bias power source provided in an embodiment.

FIG. 2b is a schematic structural diagram of a bias power source provided in an embodiment, including a reference voltage source Vref and a first resistor R1. In an example, Ibias=Vref/R1.

Figure 3:
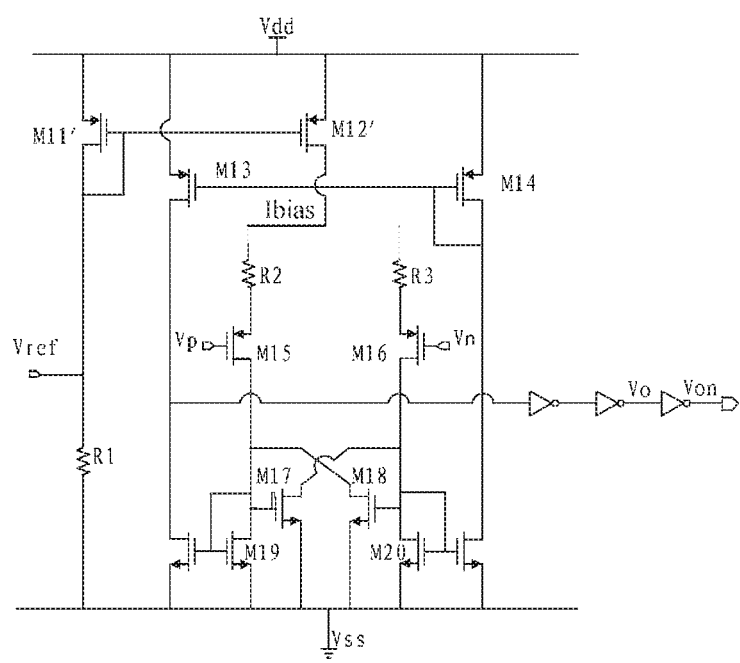
FIG. 3 is a schematic circuit diagram of a first hysteresis comparator provided in an embodiment.

FIG. 3 is a schematic circuit diagram of a first hysteresis comparator provided in an embodiment. The bias power source can include a current mirror configured to mirror a first current on the R1, and form Ibias input to a first node N1. In FIG. 3, the current mirror is formed by a transistor M11' and a transistor M12'. In this embodiment, the current mirror can be used to generate the bias current.

In addition to the resistance value of the R1, the current flowing through the R1 is also related to voltages applied to two ends of the R1. In this embodiment, the reference voltage source is configured as a band-gap voltage source capable of providing a band-gap voltage. The band-gap voltage is a voltage nearly not affected by the temperature. The band-gap voltage source is generated formed by a voltage source proportional to the temperature and a voltage source inversely proportional to the temperature, and in this way, the two voltage sources have temperature influences that can be offset, thereby maintaining a provided voltage value unchanged. The band-gap voltage provided by the band-gap voltage source is not affected by the temperature or has a very small influence quantity caused by the temperature, it indicates that Vref is not affected by the temperature or has a very small influence quantity caused by the temperature; in this way, it can be ensured that the voltage applied to two ends of the first resistor is nearly not affected by the temperature, and when the environment temperature varies, the hysteresis comparator still provides a stable hysteresis voltage and a stable hysteresis comparison result.

As shown in FIG. 3, the R2 is located in a first branch, the R3 is located in a second branch; and the first branch and the second branch are connected in parallel to a rear end of the first node N1.

A sum of the currents on the second resistor R2 and the third resistor R3 is equal to Ibias. The comparison output circuit comprises M17, M18, M19, M20, and the like. The hysteresis comparator shown in FIG. 3 further comprises a transistor M13 and a transistor M14, M13 has functions the same as those of M3 in FIG. 1, and M14 has functions the same as those of M4. The voltage comparison circuit shown in FIG. 3 is connected to the output terminal Vo through an inverter. In FIG. 3, M17, M18, M19 and M20 are the same transistors, and have the same electrical parameters. A current of the M19 is mirrored by the current mirror to a drain of the M13; and a current of the M20 is mirrored by the current mirror to a drain of the M14. In the present application, the electrical parameters may comprise volt-ampere characteristics and resistance characteristics of electronic elements, physical sizes of the electronic elements, and the like. The physical size may comprise, for example, the width, the length and the like of a transistor channel.

In the circuit shown in FIG. 3, i2 is the current flowing through the R2, i3 is the current flowing through the R3, $V_{GSM15}$ is the gate-source voltage of the M15, and $V_{GSM16}$ is the gate-source voltage of the M16.

If Va=Vb, in the comparison output circuit 120, structures connected to two ends of the M15 and M16 are symmetric. The comparison output circuit 120 in FIG. 3 may comprise the transistor M17, the transistor M19, the transistor M18, the transistor M20, and the like. These transistors are under the action of the same voltage, and of a formula Ids=$\{\mu_n C_{ox} W(V_{GS}-V_{th})^2\}/(2L)$, the current i2 flowing from a drain of the M15 will equal to the current i3 flowing from a drain of the M16, i2 is equal to i3, and therefore, $V_{GSM15}=V_{GSM16}V_{GSM15}=Vp-(V_{N1}-i2R2)$; and $V_{GSM16}=Vn-(V_{N1}-i3R3)$. The $V_{N1}$ is the voltage of the first node. The $V_{N1}-i2R2$ is the source voltage of the M15, and the $V_{N1}-i3R3$ is the source voltage of the M16.

Therefore, $$V_{TRP}^+ = Vp - Vn = V_{GSM15} - i2R2 + V_{N1} - (V_{GSM16} - i3R3 + V_{N1})$$
$$= -i2R2 + i3R3$$
$$= i2(R3 - R2) = Ibias(R3 - R2)/2 = Vref(R3 - R2)/(2R1)$$

$$V_{TRP}^- = Vn - Vp = V_{GSM16} - i3R3 + V_{N1} - (V_{GSM15} - i2R2 + V_{N1})$$
$$= -i3R3 + i2R2$$
$$= i2(-R3 + R2) = Ibias(-R3 + R2)/2$$
$$= Vref(-R3 + R2)/(2R1).$$

In this way, the hysteresis voltage Vhy=$V_{TRP}^+ - V_{TRP}^-$=Vref(R3−R2)/R1.

It is evident that the hysteresis voltage Vhy depends on Vref, R3−R2, and R1. Moreover, Vhy is proportional to R3−R2, and is inversely proportional to R1. In this embodiment, the first resistor R1, the second resistor R2 and the third resistor R3 are the same type of resistor, have approximately the same process errors, approximately the same influences caused by temperature, and therefore, the process errors and the influences caused by temperature may be offset, so that a variance of hysteresis voltages of the same batch of hysteresis comparators in batch production is small, as a result, for multiple hysteresis comparators manufactured in batch production, the overall stability and precision of the hysteresis comparators may be improved. The resistors are the same type of resistor, and have approximately the same influences caused by temperature; in this way, for a single hysteresis comparator, fluctuation of the hysteresis voltage under different temperatures is small, and therefore, the stability of work performance and the precision of the single are also improved.

In this embodiment, the Vref is the band-gap voltage provided by the band-gap voltage source, which further enhances the stability and precision of the Vhy, and improves the stability of work performance and the precision of the single hysteresis comparator.

Figure 4:
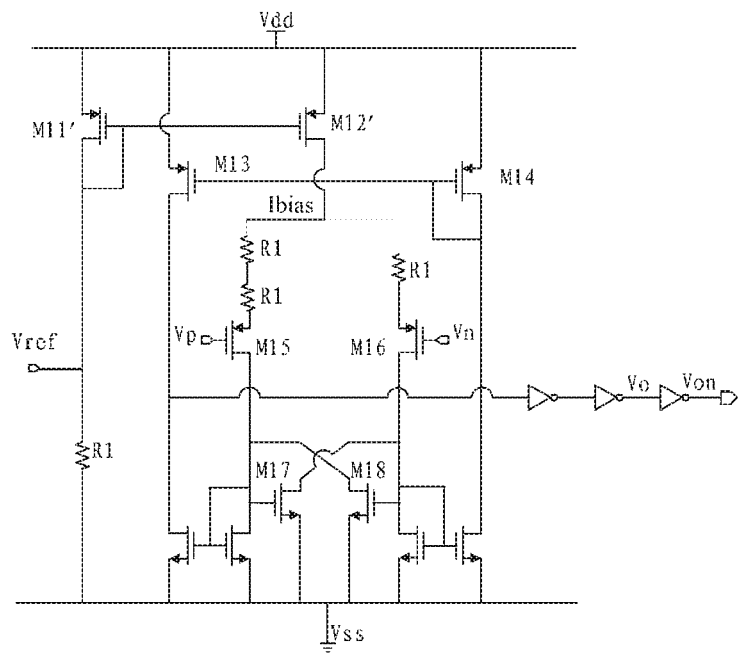
FIG. 4 is a schematic circuit diagram of a second hysteresis comparator provided in an embodiment.

FIG. 4 is a schematic circuit diagram of a second hysteresis comparator provided in an embodiment. In this embodiment, the first resistor comprises m1 fourth resistors having a first resistance value, the m1 is an integer not less than 1; the second resistor comprises m2 fourth resistors having the first resistance value; the m2 is 0 or a positive integer; the third resistor comprises m3 fourth resistors of the first resistance value; the m3 is 0 or a positive integer; and the m2 is not equal to m3.

As shown in FIG. 4, m2=2; and m3=m1=1. In FIG. 4, R1 is the fourth resistor whose resistance value is the first resistance, and in this way, the fourth resistors having the same resistance values are clearly resistors of the same type. The first resistor, the second resistor and the third resistor have a resistance value relative variation ratio caused by the temperature being 1, and have the same or similar process errors; in this way, influences caused by the second resistor and the third resistor on the hysteresis voltage can be well offset by the first resistor, and therefore, the stability and precision of the hysteresis voltage can be kept to the maximum extent.

Figure 5A:
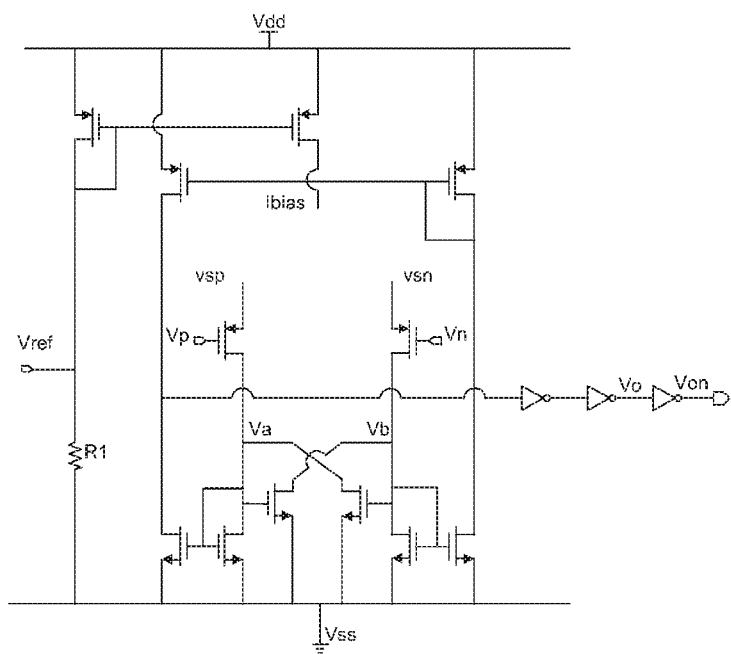
FIG. 5A to FIG. 5B are schematic circuit diagrams of a third hysteresis comparator provided in an embodiment.
Figure 5B:
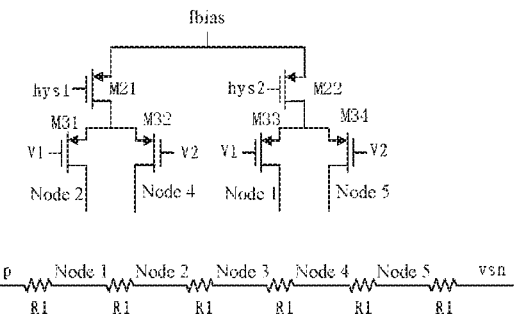

FIG. 5A to FIG. 5B are schematic circuit diagrams of a third hysteresis comparator provided in an embodiment. This embodiment provides a hysteresis comparator based on the hysteresis comparator of Embodiment 1, and the hysteresis comparator further comprises a selection circuit. The selection circuit is configured to select resistance values of the second resistor and the third resistor.

Figure 6:
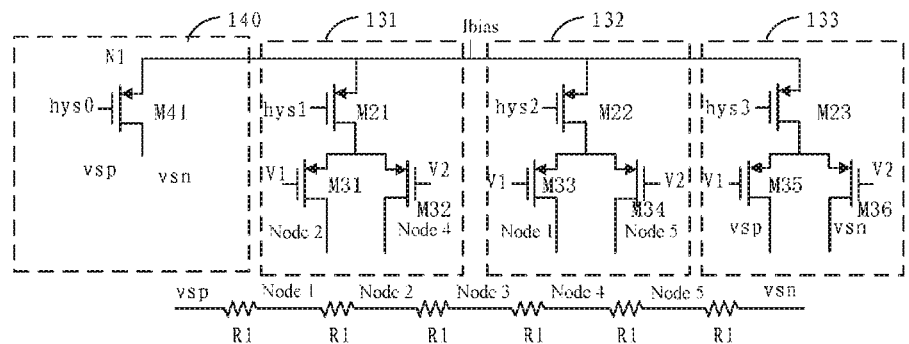
FIG. 6 is a partial schematic structural diagram of a hysteresis comparator provided in an embodiment.

As shown in FIG. 5B, the hysteresis comparator comprises 6 resistors. Resistors shown in FIG. 6 are marked by R1, it indicates that resistance values of the resistors equal to that of the fourth resistor. The resistors are connected end to end, and form a resistor string. One end of the resistor string is connected to the source of the first input transistor M15, and the other end is connected to the source of the second input transistor M16.

The selection circuit comprises multiple selection paths connected between different resistors of the resistor string, and is configured to select to switch on one of the selection paths of a selection input, so as to implement selection of the resistance values of the second resistor and the third resistor. Four selection paths are shown in FIG. 5B. These selection paths are respectively connected to different nodes of the resistor string. In FIG. 5B, the resistor string comprises 5 nodes, namely, a node 1, a node 2, a node 3, a node 4 and a node 5. In FIG. 5B, vsp is the source of the first input transistor M15, and vsn is the source of the second input transistor M16.

In this embodiment, hysteresis voltages corresponding to any two selection paths are different. Any two selection paths corresponding to different hysteresis voltages may be implemented by setting and controlling the second resistor and the third resistor in the selection path. It is assumed that a resistance difference between the second resistor and the third resistor in each selection path is a first resistance difference, and first resistance differences of any two selection paths are different. It should be noted that, "multiple" or "a plurality of" both refer to a numeral of 2 or more.

In FIG. 5B, the selection circuit further comprises a transistor M31 and a transistor M32, and the transistor M31 and the transistor M32 are connected in parallel to a drain of a transistor M21. A drain of the transistor M31 is connected to the node 2. A drain of the transistor M32 is connected to the node 4. The node 2 is located between the $2^{nd}$ R1 and the $3^{rd}$ R1 of a resistor string formed by 6 R1s located between vsp and vsn. The node 4 is located between the $4^{th}$ R1 and the $5^{th}$ R1 of the resistor string.

When Vp is greater than Vn, and a difference between Vp and Vn is greater than the positive threshold voltage, V1 inputs a logic low level, and V2 is a logic high level. In this way, the M31 is switched on, and the M32 is switched off. The second resistor of the selection path 131 is equal to 2 R1 between the node 4 and vsp, and the third resistor is equal to 4 R1 between the node 2 and vsn. A difference between the second resistor and the third resistor is equal to −2R1.

When Vp is less than Vn, and a difference between Vn and Vp is greater than the negative threshold voltage, V1 inputs a logic high level, and V2 is a logic low level. In this way, the M31 is switched off, and the M32 is switched on. In this case, the second resistor of the selection path 131 is equal to 4 R1 between the node 4 and vsp, and the third resistor is equal to 2 R1 between the node 4 and vsn. A difference between the second resistor and the third resistor is equal to 2R1. The first resistor is formed by one R1, and in this way, influences on the hysteresis voltage caused by the process errors of the resistors or reactive drift due to temperature can be well offset.

It can be known from calculation that, the hysteresis voltage Vhy corresponding to the selection path having the transistor M21 is equal to Vref*2R1/R1=2Vref; and it is evident that it is configured as that the influences on the hysteresis voltage caused by the second resistor and the third resistor generating the hysteresis voltage and the influence on the hysteresis voltage caused by the first resistor are offset, and therefore, the stability and precision of the hysteresis voltage can be ensured.

The selection circuit further comprises a transistor M33 and a transistor M34, and the transistor M33 and the transistor M34 are connected in parallel to the drain of the transistor M22. A drain of the transistor M33 is connected to the node 1, and a drain of the transistor M34 of the selection path 132 is connected to the node 5. The node 1 is located between the $1^{st}$ R1 and the $2^{nd}$ R1 of the resistor string. The node 5 is located between the $5^{th}$ R1 and the $6^{th}$ R1 of the resistor string.

If V1 is a logic low level and V2 is a logic high level, the M33 is switched on, and the M34 is switched off. The second resistor of the selection path 132 is equal to 1 R1 between the node 1 and vsp, and the third resistor is equal to 5 R1 between the node 1 and vsn. A difference between the second resistor and the third resistor is equal to −4R1.

If V1 is a logic high level and V2 is a logic low level, the M33 is switched off, and the M34 is switched on. The second resistor of the selection path 132 is equal to 5 R1 between the node 5 and vsp, and the third resistor is equal to 1 R1 between the node 5 and vsn. A difference between the second resistor and the third resistor is equal to 4R1. The first resistor is equal to the R1, and in this way, influences on the hysteresis voltage caused by the process errors of the resistors or reactive drift due to temperature can be well offset.

The level input by the V1 in the selection circuit may be the output voltage of Vo in FIG. 5A, the level input by the V2 may be the output voltage of Von in FIG. 5A. Von is an inverse voltage of Vo. In this way, the signal of the output terminal of the hysteresis comparator may be precisely used to control the resistance difference between the second resistor and the third resistor in the selection circuit.

It can be known from calculation that, the hysteresis voltage Vhy corresponding to the selection path having M22 is equal to Vref*4R1/R1=4Vref; the influences on the hysteresis voltage caused by the second resistor and the third resistor generating the hysteresis voltage and the influence on the hysteresis voltage caused by the first resistor are offset, and therefore, the stability and precision of the hysteresis voltage can be ensured.

It can be known from the above deduction that, the hysteresis voltage of the selection path having M21 is equal to 2Vref, and the hysteresis voltage of the selection path having M22 is equal to 4Vref, and in this way, the required hysteresis voltage may be selected as required when the hysteresis comparator is used.

When it is selected to switch on the selection path, it may be controlled by inputting corresponding levels to a gate hys1 of the M21 and a gate hys2 of the M22. Specifically, a voltage not less than a switch-on voltage of the M21 is input to the hys1, and a voltage less than a switch-on voltage of the M22 is input to the hys2 or no voltage is input to the hys2, it is selected to switch on the M21 and switch off the M22; therefore, the hysteresis voltage of the hysteresis comparator in this embodiment is 2Vref instead of 4Vref.

By connecting multiple selection circuits in the hysteresis comparator, one hysteresis comparator can be implemented, and voltage comparison can be performed based on different hysteresis voltages, thereby improving the availability of the hysteresis comparator.

Based on the hysteresis comparator shown in FIG. 5A and FIG. 5B, a circuit used to select switching on the selection path is further provided.

Figure 5C:
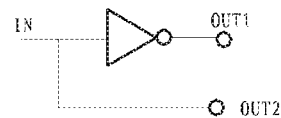
FIG. 5C is a schematic circuit diagram of a first selection circuit provided in an embodiment.

FIG. 5C is a schematic circuit diagram of a first selection circuit provided in an embodiment. As shown in FIG. 5C, the selection circuit comprises a selection input terminal IN, an inverter, a first selection output terminal OUT1 and a second selection output terminal OUT2. The selection input terminal IN is respectively connected to an input terminal of the inverter and the second selection output terminal OUT2. The first selection output terminal OUT1 is connected to an output terminal of the inverter. The first selection output terminal OUT1 shown in FIG. 5C may be connected to the gate of the M21 in FIG. 5B, and the second selection output terminal OUT2 shown may be connected to the gate of the M22 in FIG. 5B. The selection input terminal IN is configured to receive a selection input, and output signals respectively to the first selection output terminal OUT1 and the second selection output terminal OUT2 of the selection input, so as to control whether M21 and M22 are switched on, thereby implementing selecting to switch on a selection path of the selection input, for the bias current to flow through.

Compared with the hysteresis comparator shown in FIG. 6, the hysteresis comparator of this embodiment further comprises a connection circuit 140. The connection circuit is configured to connect the N1 to the source of the first input transistor M15 and the source of the second input transistor M16 without using any second resistor and third resistor. If the connection circuit 140, instead of the selection path in the hysteresis comparison circuit, is switched on, the comparator performs non-hysteresis voltage comparison. When Vp is greater than Vn, the first logic level is output from the output terminal, and when Vn is greater than Vp, the second logic level is output from the output terminal. Level values output by the first logic level and the second logic level corresponding to the same reference level are different.

It is evident that in the hysteresis comparator of this embodiment, by means of the design of the connection circuit 140, the hysteresis comparator can not only implement hysteresis comparison, but can also implement non-hysteresis voltage comparison, thereby enriching the function of the hysteresis comparator. In this way, structures such as the bias power source and the comparison output circuit of the hysteresis comparator are at least multiplexed to perform hysteresis comparison and non-hysteresis voltage comparison, and therefore, the probability of using electronic devices in the circuits is improved, and the electronic devices are further fully utilized.

Whether the hysteresis comparator performs hysteresis comparison or performs single-threshold comparison may be implemented by controlling selection inputs to hys0, hys1, hys2 and hys3. For example, when the selection input corresponding to hys0 is a signal that can switch on the M41, the connection circuit 140 is switched on.

If the switched-on selection path in Embodiment 5 is a first circuit, in this embodiment, the hysteresis comparator may further comprise a second circuit, and the second circuit may be configured to select to switch on the connection circuit 140 or any one of the selection path 131, the selection path 132 and the selection path 133.

The first circuit and the second circuit may correspond to the same selection circuit. For example, the hysteresis comparator comprises a selection path and a connection circuit, and in this case, the selection circuit in FIG. 5C may be used to switch on the selection path or the connection circuit. The first selection output terminal OUT1 in FIG. 5C may be configured to switch on the selection path when a logic high level is output, and disconnect the selection path from the bias power source when a logic low level is output. The second selection output terminal OUT2 in FIG. 5C may be configured to switch on a single-threshold hysteresis comparator when a logic high level is output, and disconnect the single-threshold hysteresis comparator from the bias power source when a logic low level is output.

FIG. 6 is a partial schematic structural diagram of a hysteresis comparator provided in an embodiment, including the connection circuit 140, and further show 3 selection circuits, the three selection circuits respectively being a selection path 131, a selection path 132 and a selection path 133. The selection path 131, the selection path 132 and the selection path 133 are all components of the selection circuit.

The connection circuit 140 comprises a transistor 41. A source of the transistor 41 is connected to the first node N1, and is configured to input the bias current Ibias. A drain of the transistor 41 is respectively connected to vsp and vsn. The source of the transistor 41 may be a selection input terminal hys0 that can receive a selection input of the second circuit.

The selection path 133 comprises a transistor 23, a transistor 35 and a transistor 36. The transistor 35 and the transistor 36 are connected in parallel to a drain of the transistor 23. A gate of the transistor 23 is a selection input terminal hys3 receiving the selection input. When the M35 is switched on and the M36 is switched off, a resistance value corresponding to a second resistor of the selection path 133 is 0, and a third resistor of the selection path 133 is 6 R1 from vsp to vsn. When the M36 is switched on and the M35 is switched off, a resistance value corresponding to a second resistor of the selection path 133 is 6 R1 from vsp to vsn, and a resistance value of a third resistor of the selection path 133 is 0. Referring to FIG. 5A and FIG. 6, of the deduction in the above embodiment, the selection path 133 is used for the hysteresis comparator shown in FIG. 5A, and the hysteresis voltage generated by the selection 133 is Vhy=Vref*6R1/R1=6Vref.

Figure 7:
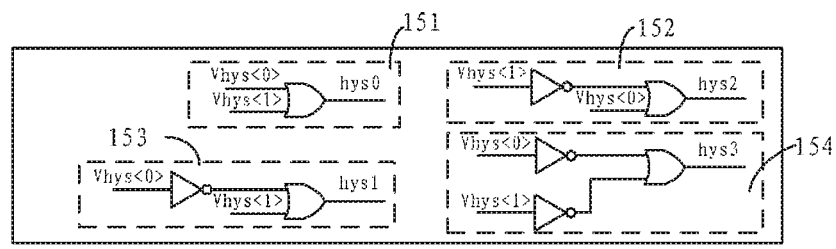
FIG. 7 is a schematic circuit diagram of a selection circuit provided in an embodiment.

FIG. 7 is a schematic circuit diagram of a selection circuit provided in an embodiment. The circuit of FIG. 7 may be a circuit that is used to select to switch on the selection path and is applicable to the circuit structure shown in FIG. 6. The circuit shown in FIG. 7 comprises two selection input terminals, and it is assumed that one of the two selection input terminals is a first selection input Vhys<1> and the other one is a second selection input Vhys<0>. The first selection input terminal and the second selection input terminal are both configured to receive the selection input.

The circuit shown in FIG. 7 comprises 4 selection modules, respectively comprising a selection module 151, a selection module 152, a selection module 153 and a selection module 154.

The selection module 151 comprises an OR gate, and two input terminals of the OR gate are respectively connected to Vhys<1> and Vhys<0>. A selection output terminal of the OR gate of the selection module 151 is connected to the gate of the M41 in FIG. 6. In this way, when two selection inputs Vhys<1> and Vhys<0> are both logic low levels, the M41 is switched on, and the hysteresis comparator performs single-threshold voltage comparison.

The selection module 152 comprises an inverter and an OR gate. An input terminal of the inverter of the selection module 152 is connected to Vhys<1>, and an output of the inverter is connected to an input terminal of the OR gate of the selection module 152. Another input terminal of the OR gate of the selection module 152 is connected to Vhys<0>. The output terminal of the OR gate of the selection module 152 is connected to the gate of the transistor M22 of the selection path 132. When the selection input received by Vhys<1> is a logic high level and the selection input received by Vhys<0> is a logic low level, the selection path 132 is switched on.

The selection module 153 comprises an inverter and an OR gate. An input terminal of the inverter of the selection module 153 is connected to Vhys<0>, and an output terminal of the inverter of the selection module 153 is connected to an input terminal of the OR gate of the selection module 153. Another input terminal of the OR gate of the selection module 153 is connected to Vhys<1>. The output terminal of the selection module 153 is connected to the gate of the transistor M21 in the selection path 131. When the selection input received by Vhys<1> is a logic low level and the selection input received by Vhys<0> is a logic high level, the selection path 131 is switched on.

The selection module 154 comprises two inverters and an OR gate. An input terminal of one inverter of the selection module 154 is connected to Vhys<0>, and another inverter is connected to Vhys<1>. Outputs of two inverters of the selection module 154 are inputs of the OR gate of the selection mode 154. An output terminal of the OR gate of the selection module 154 is connected to the gate of the transistor M23 of the selection path 133. In this way, when the selection input received by Vhys<0> is a logic high level and the selection input received by Vhys<1> is also a logic high level, the selection path 133 is switched on. In this way, an input state of each of the two selection inputs may only switch on one of M41, M21, M22 and M23.

The present application further provides an embodiment of an integrated circuit, and the integrated circuit may comprise the hysteresis comparator in any technical solution in Embodiment 1 to Embodiment 7. The integrated circuit in this embodiment may comprise a dielectric-slab and various electronic elements located on the dielectric-slab. The electronic elements can at least connect to form one of the hysteresis comparators. The dielectric-slab may be a printed circuit board. The integrated circuit may be a circuit formed by a manufacturing process such as oxidization, lithography, diffusion, epitaxy, evaporation of aluminum, and the like.

The integrated circuit of this embodiment can perform voltage comparison based on the hysteresis voltage, the hysteresis voltage has small fluctuation amplitude, and the result of voltage comparison has high precision and stability.

In the integrated circuit in this embodiment, the resistance differences between the first resistor, the second resistor and the third resistor are used to provide the hysteresis voltage, thereby providing a stable hysteresis voltage and a precise voltage comparison result. When the integrated circuit comprises at least two selection circuits, the integrated circuit can select, of actual requirements, a selection circuit to provide the hysteresis voltage to perform voltage comparison. The integrated circuit in this embodiment further comprises a connection circuit, and can perform single-threshold voltage comparison; and in this way, electronic devices can be better utilized, thereby implementing different types of voltage comparison.

FIG. 8 is a schematic simulation effect diagram of a hysteresis comparator provided in an embodiment. In FIG. 8, the input voltage of Vn is kept constant, the voltage value is equal to 562 mv, and the input voltage of Vp rises gradually from 300.0 mv. Finally, as shown in FIG. 5A, the output terminal of the hysteresis comparator is further connected to an inverter, which inverts the voltage of the output terminal Vo of the hysteresis comparator to form Von. The simulation result in FIG. 8 is a simulation result based on Von. It is evident from FIG. 8 that, when the input voltage of Vp rises gradually to about 684.0 mv, the output of Von drops from 5.5V to 0V. When the input voltage of Vp drops gradually, and when it drops to about 420.0 mv, the output of Von rises from 0V to 5.5V.

It can be known from the drawing of FIG. 8 that, vertical lines near 420 mv and 684.0 mv comprise three types, and the vertical lines of the same type represent effects of the same simulation. An ideal hysteresis voltage of this simulation is 255 mv.

It can be known from the drawing of FIG. 8 that, the maximum value of the actual hysteresis voltage may be one of deta1 or deta2 in FIG. 8. deta1=696.5−425.5=271; deta2=687−435=252. Therefore, a fluctuation amplitude of the deta1 relative to the ideal hysteresis voltage is equal to (deta1−255)/255=0.0627; and an effect of the deta2 relative to the ideal hysteresis voltage is equal to (255−deta2)/255=0.0627=0.01176. In this embodiment, the fluctuation amplitude of the hysteresis voltage is less than 7%, far less than 30% in the prior art. It is evident that the stability and precision of the work performance of the hysteresis comparator are greatly improved.

Data in the following table is simulation data of a hysteresis comparator provided by an embodiment of the present application.

| Temperature | Vdd | Ibias | Vn | $V_{TRP}^+$ | $V_{TRP}^-$ | Vhy |
|---|---|---|---|---|---|---|
| −40° C. | 5.5 V | 400 nA | 562 mv | 604.5 mv | 519.5 mv | 85 mv |
| 25° C. | 5.5 V | 400 nA | 562 mv | 604.5 mv | 519.5 mv | 85 mv |
| 85° C. | 5.5 V | 400 nA | 562 mv | 605.5 mv | 518.5 mv | 87 mv |
| 125° C. | 5.5 V | 400 nA | 562 mv | 605.5 mv | 518.4 mv | 87.1 mv |

First, it can be seen from the table that, the fluctuation change of the hysteresis voltage is very small, and the fluctuation amplitude of the hysteresis voltage is far less than 30% of the hysteresis comparator in the prior art. Even the temperature changes from −40° C. to 125° C., the fluctuation range of the hysteresis voltage is merely 2.1 mv, and the fluctuation amplitude is very small.

FIG. 9 is a schematic flow chart of a voltage comparison method provided in an embodiment, including:

Step S101: applying a first input voltage to a gate of a first input transistor;

Step S102: applying a second input voltage to a gate of a second input transistor;

Step S103: generating a bias current by using a first resistor;

Step S104: making a part of the bias current flow into the source of the first input transistor through the second resistor, and other part of the bias current flow into the source of the second input transistor through the third resistor; and Step S105: outputting a signal indicating that a drain voltage of the first input transistor is greater than or less than a drain voltage of the second input transistor; wherein the first resistor, the second resistor and the third resistor are the same type of resistor, and the second resistor and the third resistor have different resistance values.

In this embodiment, the bias current is generated by using the first resistor, and generally, the bias current is equal to a current flowing through the first resistor; in this way, the bias current is equal to a ratio of a voltage applied to two ends of the first resistor to a resistance value of the first resistor. The resistance value of the first resistor affects the magnitude of the bias current.

In the method of this embodiment, the bias current is divided by using a second resistor and a third resistor. A hysteresis voltage is generated based on the bias current by using a resistance difference between the second resistor and the third resistor in the above embodiments. The magnitude of the hysteresis voltage is proportional of the bias current, and is inversely proportional to the resistance difference of the first resistor and the second resistor. The first resistor, the second resistor and the third resistor are the same type of resistor. In this way, manufacturing process errors and influences caused by the temperature of the first resistor, the second resistor and the third resistor are approximately the same, so that the influences on the hysteresis voltage can be offset, thereby keeping the stability of the hysteresis voltage. Therefore, voltage comparison is performed based on the hysteresis voltage having high stability and precision, and a more precise comparison result may be obtained.

In this embodiment, the step S103 may comprise: applying a voltage to the first resistor to form a first current, and mirroring the first current to form the bias current. How to mirror the first current specifically may be implemented by mirroring the first current by using a cascode current mirror formed by the transistor M11' and the transistor M12' shown in FIG. 4.

The bias current is generated by mirroring, so that the implementation is convenient, and an adopted circuit structure is simple.

It should be noted that, arrows in FIG. 9 do not represent an execution order from step S101 to step S105. For example, steps such as step S101 and step S102 do not have any sequence.

In an embodiment, the step S103 may comprise: applying a band-gap voltage to the first resistor, and generating a first current by the application of the band-gap voltage on the first resistor.

The band-gap voltage is a voltage that is nearly not affected by the temperature or is not affected by the temperature, and in this way, the stability of the voltage applied to the first resistor can be ensured, so as to ensure the stability of the first current, thereby ensuring the stability of the bias current, and further improving the stability of a comparison result of the voltage comparison method.

By forming the bias current in this manner, the stability of forming the bias current is high, and the implementation is convenient.

The voltage comparison method can further include:

receiving a selection input; and selecting, of the selection input, the second resistor and the third resistor for partial currents of the bias current to pass through.

By selecting resistance values of the second resistor and the third resistor, multiple different hysteresis voltages may be formed, and therefore, hysteresis comparison may be performed by selecting a hysteresis voltage as required.

In this embodiment, when the resistance values of the second resistor and the third resistor are selected, it may be implemented by using the circuits shown in FIG. 5B\FIG. 5C, FIG. 6 and FIG. 7.

Figure 10:
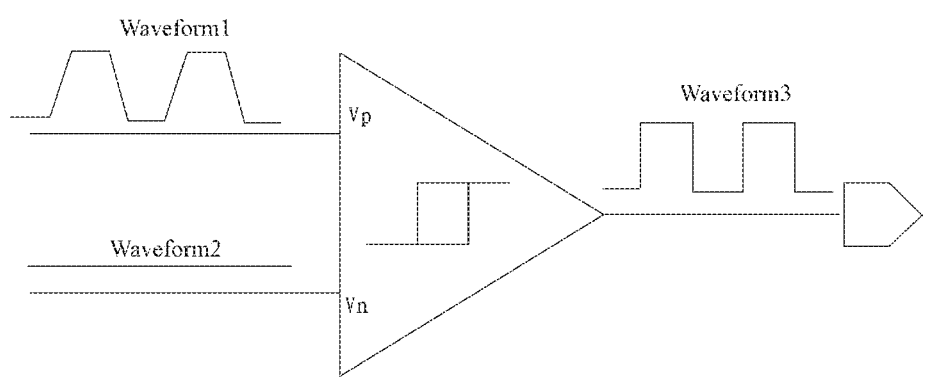
FIG. 10 is another schematic structural diagram of a hysteresis comparator provided in an embodiment.

FIG. 10 is another schematic structural diagram of a hysteresis comparator or the integrated circuit, described above. The circuit comprises two input terminals, one is a first input terminal Vp, the other is a second input terminal Vn, a waveform of an input voltage of the first input terminal Vp is shown by a waveform 1 in FIG. 10, and a waveform of an input voltage of the second input terminal Vn is shown by a waveform 2 in FIG. 10. The circuit in FIG. 10 generates a hysteresis voltage, compares input voltages of Vn and Vp with the hysteresis voltage, and after the comparison, input and output result shown by a waveform 3 shown in FIG. 10. It is evident from FIG. 10 that, the circuit of this embodiment can be configured to eliminate an interference voltage of the input voltage of Vp, thereby forming a regular rectangular wave. It is evident that the circuit in FIG. 10 adopts the hysteresis comparator or integrated circuit of this embodiment, so that the problem of unstable time corresponding to a logic high level or logic low level of the output rectangular wave caused by the fluctuation of the hysteresis voltage can be reduced.

Moreover, in the embodiments of the present application, the input voltage of the second input terminal of the hysteresis comparator may be a voltage input by a programmable circuit, and in this way, it is convenient to subsequently adjust the input voltage of the second input terminal Vn of specific usage requirements.

In the several embodiments provided in the present application, it should be understood that, the disclosed method may be implemented in other manners. The device embodiment described in the foregoing is merely schematic, for example, the division of units is merely division of logic functions, and in fact, there may be other division manners during implementation, for example, multiple units or components may be combined or may be integrated into another system, or some features may be omitted or not be executed. In addition, the displayed or discussed coupling or direct coupling or communication connection between the components may be implemented through some interfaces, and indirect coupling or communication connection between devices or units, and may be in the form of electrical, mechanical or other forms.

Units described as separated parts may be or may not be physically separated, parts displayed as units may be or may not be physical units, and they may be located at the same place, or be distributed to multiple network units. A part or all of the units may be selected of actual requirements to implement the objective of the solution of this embodiment.

In addition, functional units may be integrated in a processing module, the units may also be each served as a separate unit, or two or more units are integrated into one unit. The integrated units may be implemented in a form of hardware, and may also be implemented in a form of hardware plus software function units.

Persons of ordinary skill in the art may understand that all or a part of steps of the method embodiment may be implemented by a program instructing related hardware, the program may be stored in a computer readable storage medium, and when the program is executed, the steps of the method embodiment are executed; the storage medium includes various mediums capable of storing program codes, such as a mobile storage device, a Read-Only Memory (ROM), a Random Access Memory (RAM), a magnetic disk, an optical disc, and the like.

The above descriptions are merely specific implementation manners of the present invention, the protection scope of the present invention is not limited thereto, and variations or replacements that can be easily derived by persons skilled in the art without departing from the technical scope disclosed in the present invention shall fall within the protection scope of the present invention. Therefore, the protection scope of the present invention shall be subject to the protection scope of the claims.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. If two elements are shown in the drawings with a line connecting them, the two elements can be either be coupled, or directly coupled, unless otherwise indicated. If two elements are coupled, one or more intervening elements may be present. In contrast, in embodiments where an element is referred to as "directly coupled" to another element, there can be no intervening elements in those embodiments.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A comparator circuit, comprising:
   a first input transistor including a gate configured to receive a first input voltage;
   a second input transistor including a gate configured to receive a second input voltage;
   a first node configured to receive a bias current using a first resistor, the first node coupled to a source of the first input transistor through a second resistor and coupled to a source of the second input transistor through a third resistor;
   a comparison output circuit configured to receive a drain voltage from a drain of the first input transistor and to receive a drain voltage from a drain of the second input transistor, and to provide an output signal indicating that the drain voltage of the first input transistor is greater than or less than the drain voltage of the second input transistor; and
   a hysteresis comparator including the first and second input transistors, the first, second, and third resistors, and the comparison output circuit,
   wherein the first resistor, the second resistor and the third resistor are the same type of resistor, and the second resistor and the third resistor have different resistance values.

2. The comparator circuit of claim 1, including:
   a bias power source configured to apply a voltage to the first resistor to provide the bias current to the first node.

3. The comparator circuit of claim 1, including:
   a reference voltage source configured to apply a voltage to the first resistor to form a first current; and
   a current mirror configured to mirror the first current to provide the bias current.

4. The comparator circuit of claim 3, wherein the reference voltage source is a band-gap voltage source, and wherein the voltage is a band-gap voltage.

5. The comparator circuit of claim 1, wherein the first resistor includes m1 fourth resistors having a first resistance value, where m1 is a positive integer,
   wherein the second resistor includes m2 fourth resistors having the first resistance value, wherein m2 is a positive integer,
   wherein the third resistor includes m3 fourth resistors having the first resistance value, wherein m3 is a positive integer, and
   wherein m2 is greater than m3.

6. The comparator circuit of claim 1, including:
   a selection circuit configured to select resistance values of the second resistor and the third resistor.

7. The comparator circuit of claim 6, including:
   a resistor string including multiple resistors connected end to end,
   wherein a first end of the resistor string is connected to the source of the first input transistor, and a second end of the resistor string is connected to the source of the second input transistor, and
   wherein the selection circuit comprises multiple selection paths connected between different resistors of the resistor string, and is configured to select one of the selection paths of a selection input, so as to implement selection of the resistance values of the second resistor and the third resistor.

8. The comparator circuit of claim 1, wherein the comparison output circuit is configured to provide the output signal to an output terminal.

9. The comparator circuit of claim 1, including an integrated circuit including the first and second input transistors, the first, second, and third resistors, and the comparison output circuit.

10. A voltage comparison method comprising:
    receiving a first input voltage at a gate of a first input transistor;
    receiving a second input voltage at a gate of a second input transistor;
    receiving a bias current at a first node using a first resistor, the first node coupled to a source of the first input transistor through a second resistor and coupled to a source of the second input transistor through a third resistor;
    receiving a drain voltage from a drain of the first input transistor at a comparison output circuit;
    receiving a drain voltage from a drain of the second input transistor at the comparison output circuit;
    providing, using the comparison output circuit, an output signal indicating that the drain voltage of the first input transistor is greater than or less than the drain voltage of the second input transistor; and selecting resistance values of the second and third resistors using a selection circuit, wherein the first resistor, the second resistor and the third resistor are the same type of resistor, and the second resistor and the third resistor have different resistance values.

11. The voltage comparison method of claim 10, wherein receiving the bias current includes receiving a voltage from a bias power source through the first resistor.

12. The voltage comparison method of claim 10, including:

receiving a voltage at the first resistor to form a first current;

mirroring the first current using a current mirror to provide the bias current.

13. The voltage comparison method of claim 12, wherein receiving the voltage includes receiving a band-gap voltage from a band-gap voltage source.

14. The voltage comparison method of claim 10, wherein the first resistor includes m1 fourth resistors having a first resistance value, where m1 is a positive integer, wherein the second resistor includes m2 fourth resistors having the first resistance value, wherein m2 is a positive integer, wherein the third resistor includes m3 fourth resistors having the first resistance value, wherein m3 is a positive integer, and wherein m2 is greater than m3.

15. The voltage comparison method of claim 10, wherein selecting resistance values of the second and third resistors using the selection circuit includes selecting one of multiple selection paths between a string of multiple resistors connected between the source of the first input transistor and the source of the second input transistor.

16. The voltage comparison method of claim 10, wherein providing the output signal includes to an output terminal.

17. A system comprising:

a first input transistor including a gate configured to receive a first input voltage;

a second input transistor including a gate configured to receive a second input voltage;

a first node configured to receive a bias current using a first resistor, the first node coupled to a source of the first input transistor through a second resistor and coupled to a source of the second input transistor through a third resistor;

means for providing an output signal indicating that a drain voltage of the first input transistor is greater than or less than the drain voltage of the second input transistor; and means for selecting resistance values of the second and third resistors, wherein the first resistor, the second resistor and the third resistor are the same type of resistor, and the second resistor and the third resistor have different resistance values.

18. The system of claim 17, wherein the type of resistor comprises one of a well resistor, a poly resistor, a p+ resistor, or an n+ resistor.

19. The system of claim 17, further comprising a current mirror configured to provide the bias current.

20. The system of claim 17, wherein the means for selecting comprises means for selecting multiple selection paths coupled between different resistors of a resistor string, wherein the second and third resistors are part of the resistor string.

* * * * *